(12) United States Patent
Zhang

(10) Patent No.: US 9,503,125 B2
(45) Date of Patent: Nov. 22, 2016

(54) MODIFIED TRELLIS-BASED MIN-MAX DECODER FOR NON-BINARY LOW-DENSITY PARITY-CHECK ERROR-CORRECTING CODES

(71) Applicant: SANDISK ENTERPRISE IP LLC, Dallas, TX (US)

(72) Inventor: Xinmiao Zhang, Seattle, WA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 70 days.

(21) Appl. No.: 14/272,621

(22) Filed: May 8, 2014

(65) Prior Publication Data

US 2015/0326249 A1 Nov. 12, 2015

(51) Int. Cl.
*H03M 13/11* (2006.01)
*G06F 11/10* (2006.01)

(52) U.S. Cl.
CPC ...... *H03M 13/1137* (2013.01); *G06F 11/1012* (2013.01); *G06F 11/1068* (2013.01); *H03M 13/1102* (2013.01); *H03M 13/1125* (2013.01); *H03M 13/1171* (2013.01)

(58) Field of Classification Search
CPC .............. H03M 13/1137; H03M 13/1102; H03M 13/1125
See application file for complete search history.

(56) References Cited

U.S. PATENT DOCUMENTS

| | | | | |
|---|---|---|---|---|
| 7,990,290 B1* | 8/2011 | Jagmohan | ............... | H03M 7/30 341/50 |
| 8,418,023 B2 | 4/2013 | Gunnam et al. | | |
| 8,443,271 B1* | 5/2013 | Zhang | ................ | H03M 13/1108 714/794 |
| 8,516,347 B1* | 8/2013 | Li | ...................... | H03M 13/1114 714/778 |
| 8,667,361 B1* | 3/2014 | Varnica | ................... | G06F 11/10 714/752 |
| 8,751,889 B2* | 6/2014 | Zhang | ................ | H03M 13/1111 714/746 |
| 8,751,912 B1* | 6/2014 | Varnica | ................... | G06F 11/00 714/785 |
| 8,880,973 B1* | 11/2014 | Li | ...................... | H03M 13/255 714/752 |
| 8,938,660 B1* | 1/2015 | Varnica | ................ | H03M 13/00 714/755 |
| 8,996,969 B2* | 3/2015 | Bolotov | ............. | H03M 13/1111 714/752 |
| 9,059,746 B2* | 6/2015 | Dixon | ............... | H03M 13/6312 |
| 9,153,331 B2 | 10/2015 | D'Abreu et al. | | |
| 2003/0033575 A1* | 2/2003 | Richardson | .............. | G06N 3/02 714/799 |
| 2004/0081073 A1 | 4/2004 | Walton et al. | | |
| 2004/0252791 A1* | 12/2004 | Shen | .................. | G11B 20/1833 375/340 |
| 2004/0255228 A1* | 12/2004 | Shen | .................. | G11B 20/1833 714/792 |

(Continued)

OTHER PUBLICATIONS

Savin, V., "Min-Max decoding for non binary LDPC codes," in Information Theory, 2008. ISIT 2008. IEEE International Symposium on , vol., no., pp. 960-964, Jul. 6-11, 2008.*

(Continued)

*Primary Examiner* — Joseph D Torres
(74) *Attorney, Agent, or Firm* — Toler Law Group, PC

(57) ABSTRACT

A decoder includes a syndrome value calculator configured to generate multiple syndrome values. The decoder further includes a check node to variable node message generator that is coupled to the syndrome value calculator. The check node to variable node message generator is configured to generate multiple check node to variable node messages in a single clock cycle based on the multiple syndrome values.

18 Claims, 4 Drawing Sheets

(56) References Cited

U.S. PATENT DOCUMENTS

| | | | |
|---|---|---|---|
| 2004/0255231 A1* | 12/2004 | Shen | G11B 20/1833 714/801 |
| 2004/0258177 A1* | 12/2004 | Shen | H03M 13/1117 375/308 |
| 2005/0028071 A1* | 2/2005 | Shen | H03M 13/1105 714/800 |
| 2005/0193320 A1* | 9/2005 | Varnica | H03M 13/1111 714/800 |
| 2005/0229090 A1* | 10/2005 | Shen | H03M 13/1137 714/801 |
| 2005/0268206 A1* | 12/2005 | Tran | H03M 13/1117 714/758 |
| 2005/0283707 A1* | 12/2005 | Sharon | H03M 13/1137 714/758 |
| 2006/0020870 A1 | 1/2006 | Hocevar | |
| 2006/0150055 A1 | 7/2006 | Quinard et al. | |
| 2007/0245214 A1 | 10/2007 | Ramamoorthy | |
| 2008/0028282 A1* | 1/2008 | Zhong | H03M 13/1102 714/794 |
| 2009/0282319 A1* | 11/2009 | No | H03M 13/1108 714/780 |
| 2010/0017676 A1* | 1/2010 | Gross | H04L 1/0057 714/752 |
| 2010/0042906 A1* | 2/2010 | Gunnam | H03M 13/1111 714/780 |
| 2011/0087933 A1* | 4/2011 | Varnica | H03M 13/112 714/704 |
| 2011/0252286 A1* | 10/2011 | Li | H03M 13/1171 714/755 |
| 2011/0264979 A1* | 10/2011 | Gunnam | H03M 13/1128 714/752 |
| 2011/0293045 A1* | 12/2011 | Gross | H04L 1/005 375/340 |
| 2012/0134446 A1 | 5/2012 | Zhou et al. | |
| 2012/0173947 A1* | 7/2012 | Voicila | H03M 13/1134 714/752 |
| 2012/0185744 A1* | 7/2012 | Varnica | H03M 13/1108 714/752 |
| 2013/0061107 A1* | 3/2013 | Wang | H03M 13/1117 714/752 |
| 2013/0061112 A1* | 3/2013 | Chen | H03M 13/114 714/758 |
| 2013/0139022 A1* | 5/2013 | Chen | H03M 13/1117 714/752 |
| 2013/0156133 A1* | 6/2013 | Gentile | H03M 13/1111 375/340 |
| 2013/0346824 A1* | 12/2013 | Bolotov | H03M 13/1111 714/755 |

OTHER PUBLICATIONS

Huang, Q. et al. "A Low-Complexity Encoding of Quasi-Cyclic Codes Based on Galois Fourier Transform," Cornell University Library, arXiv.org > cs > arXiv:1301.3220v1, submitted Jan. 15, 2013, 8 pages.

Zhang, Xinmiao et al. "High-Speed Multi-Block-Row Layered Decoder for Low Density Parity Check (LDPC) Codes," U.S. Appl. No. 14/257,800, filed Apr. 21, 2014, 41 pages.

Zhang, Xinmiao et al. "Low Complexity Partial Parallel Architectures for Fourier Transform and Inverse Fourier Transform over Subfields of a Finite Field," U.S. Appl. No. 14/258,679, filed Apr. 22, 2014, 44 pages.

Zhang, Xinmiao "Interleaved Layered Decoder for Low-Density Parity Check Codes," U.S. Appl. No. 14/258,843, filed Apr. 22, 2014, 34 pages.

Zhang, Xinmiao et al. "Encoder with Transform Architecture for LDPC Codes Over Subfields Using Message Mapping," U.S. Appl. No. 14/316,117, filed Jun. 26, 2014, 38 pages.

Zhang, Xinmiao et al. "Encoder for Quasi-Cyclic Low-Density Parity-Check Codes Over Subfields Using Fourier Transform," U.S. Appl. No. 14/316,128, filed Jun. 26, 2014, 36 pages.

Huang, Q. et al. "Low-Complexity Encoding of Quasi-Cyclic Codes Based on Galois Fourier Transform," IEEE Transactions on Communications, vol. 62, Issue 6, Jun. 2014, 10 pages.

Ardakani, Masoud "Efficient Analysis, Design and Decoding of Low-Density Parity-Check Codes," Doctoral Dissertation, http://www.ece.ualberta.ca/~ardakani/Ardakani_thesis.pdf, 2004, 164 pages.

Wymeersch, Henk et al. "Log-Domain Decoding of LDPC Codes Over GF(q)," IEEE International Conference on Communications, vol. 2, Jun. 2004, pp. 772-776.

Tarable, Alberto et al. "Mapping Interleaving Laws to Parallel Turbo and LDPC Decoder Architectures," IEEE Transactions on Information Theory, vol. 50, No. 9, Sep. 2004, pp. 2002-2009.

Hocevar, Dale E. "A Reduced Complexity Decoder Architecture via Layered Decoding of LDPC Codes," IEEE Workshop on Signal Processing Systems, Oct. 2004, pp. 107-112.

Neeb, Christian et al. "Network-on-Chip-Centric Approach to Interleaving in High Throughput Channel Decoders," IEEE International Symposium on Circuits and Systems, vol. 2, May 2005, pp. 1766-1769.

Mansour, Mohammad M. et al. "A 640-Mb/s 2048-Bit Programmable LDPC Decoder Chip," IEEE Journal of Solid-State Circuits, vol. 41, No. 3, Mar. 2006, pp. 684-698.

Darabiha, Ahmad et al. "A Bit-Serial Approximate Min-Sum LDPC Decoder and FPGA Implementation," IEEE International Symposium on Circuits and Systems, May 2006, pp. 149-152.

Declercq, David et al. "Decoding Algorithms for Nonbinary LDPC Codes Over GF (q)," IEEE Transactions on Communications, vol. 55, No. 4, Apr. 2007, pp. 633-643.

Gunnam, Kiran et al. "Multi-Rate Layered Decoder Architecture for Block LDPC Codes of the IEEE 802.11n Wireless Standard," IEEE International Symposium on Circuits and Systems, May 2007, pp. 1645-1648.

Savin, Valentin "Min-Max Decoding for Non Binary LDPC Codes," IEEE International Symposium on Information Theory, Jul. 2008, pp. 960-964.

Darabiha, Ahmad et al. "Power Reduction Techniques for LDPC Decoders," IEEE Journal of Solid-State Circuits, vol. 43, No. 8, Aug. 2008, pp. 1835-1845.

Zhou, Bo et al. "Construction of Non-Binary Quasi-Cyclic LDPC Codes by Arrays and Array Dispersions," IEEE Transactions on Communications, vol. 57, No. 6, Jun. 2009, pp. 1652-1662.

Jin, Jie et al. "An Energy Efficient Layered Decoding Architecture for LDPC Decoder," IEE Transactions on Very Large Scale Integration (VLSI) Systems, vol. 18, No. 8, Aug. 2010, pp. 1185-1195.

Lee, Kihoon et al. "A High-Speed Low-Complexity Concatenated BCH Decoder Architecture for 100 Gb/s Optical Communications," Springer Science+Business Media, LLC, Aug. 2010, 13 pages.

Sun, Yang et al. "Multi-Layer Parallel Decoding Algorithm and VLSI Architecture for Quasi-Cyclic LDPC Codes," IEEE International Symposium on Circuits and Systems, May 2011, pp. 1776-1779.

Zhang, Xinmiao et al. "Reduced-Complexity Decoder Architecture for Non-Binary LDPC Codes," IEEE Transactions on Very Large Scale Integration (VLSI) Systems, vol. 19, No. 7, Jul. 2011, pp. 1229-1238.

Chen, Xiaoheng et al. "High-Throughput Efficient Non-Binary LDPC Decoder Based on the Simplified Min-Sum Algorithm," IEEE Transactions on Circuits and Systems-I: Regular Papers, vol. 59, No. 11, Nov. 2012, pp. 2784-2794.

Li, Erbao et al. "Trellis-Based Extended Min-Sum Algorithm for Non-Binary LDPC Codes and its Hardware Structure," IEEE Transactions on Communications, vol. 61, No. 7, Jul. 2013, pp. 2600-2611.

Cai, Fang et al. "Relaxed Min-Max Decoder Architectures for Nonbinary Low-Density Parity-Check Codes," IEEE Transactions on Very Large Scale Integration (VLSI) Systems, vol. 21, No. 11, Nov. 2013, pp. 2010-2023.

Non-Final Office Action mailed Oct. 27, 2015 in U.S Appl. No. 14/258,843, 5 pages.

(56) References Cited

OTHER PUBLICATIONS

Zhou et al., "Array Dispersions of Matrices and Constructions of Quasi-Cyclic LDPC Codes Over Non-Binary Fields", IEEE International Symposium on Information Theory, Toronto, Canada, Jul. 6-11, 2008, 1158-1162.
Non-Final Office Action mailed Jan. 8, 2016 in U.S. Appl. No. 14/257,800, 10 pages.
Cui, Z. et al. "Reduced-Complexity Column-Layered Decoding and Implementation for LDPC Codes," IET Communications, 2011, vol. 5, Issue 15, pp. 2177-2186.
Notice of Allowance mailed Mar. 15, 2016 in U.S. Appl. No. 14/258,843, 5 pages.

* cited by examiner

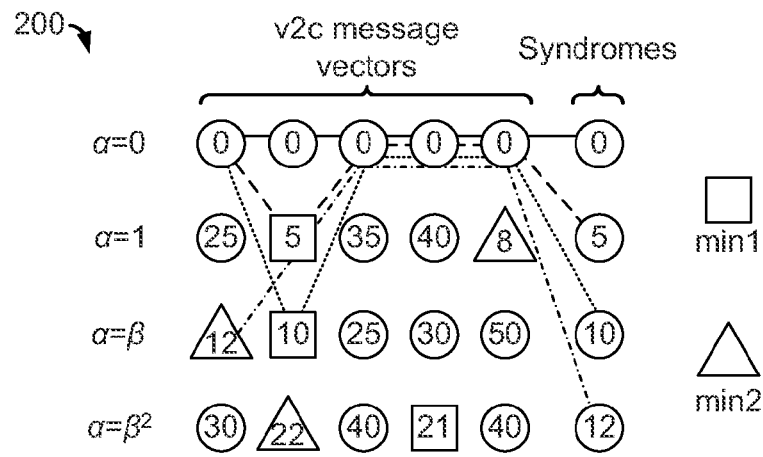

*inputs:* $w(\alpha)$, $min1(\alpha)$, $idx(\alpha)$, $min2(\alpha)$, $\eta^{(\alpha)}$
for each $\alpha \neq 0$
  If there is one deviation node, and it is in stage $i$:
  $$\hat{v}_{m,n}(\alpha) = \begin{cases} min1(\alpha) & \text{if } n \neq i \\ min2(\alpha) & \text{if } n = i \end{cases}$$
  If there are two deviation nodes, and they are in stages $i$ and $j$:
  $$\hat{v}_{m,n}(\alpha) = \begin{cases} w(\alpha) & \text{if } n \neq i,j \\ min1(\alpha) & \text{if } n = i \text{ or } j \text{ and } n \neq idx(\alpha) \\ min2(\alpha) & \text{if } n = i \text{ or } j \text{ and } n = idx(\alpha) \end{cases}$$

*Example Terminology:*
$w(\alpha)$ - syndrome value
$\alpha$ - indication of a particular row
$min1(\alpha)$ - first value
$min2(\alpha)$ - second value
$\eta^{(\alpha)}$ - node value for a particular path
$i$ - first column index value
$j$ - second column index value
$idx(\alpha)$ - third column index value
$n$ - variable node index value
$\hat{v}_{m,n}(\alpha)$ - check node to variable node value

FIG. 3

MODIFIED TRELLIS-BASED MIN-MAX DECODER FOR NON-BINARY LOW-DENSITY PARITY-CHECK ERROR-CORRECTING CODES

FIELD OF THE DISCLOSURE

The present disclosure is generally related to low-density parity-check (LDPC) decoders.

BACKGROUND

Nonvolatile data storage devices, such as embedded memory devices and removable memory devices, enable portability of data and software applications. In certain flash memory devices, multi-level cell (MLC) storage elements may each store a threshold voltage representing multiple bits of data, enhancing data storage density as compared to single-level cell (SLC) flash memory devices. The enhanced storage density may be associated with increased data errors, such as data corruption.

To correct data errors, a flash memory device may utilize an error correcting code (ECC) technique. For example, the flash memory device may encode user data using an ECC technique to generate encoded data, such as an ECC codeword. The encoded data may be stored at the flash memory device and may be decoded by a decoder of the flash memory device, such as in response to a request for read access to the data from a host device that accesses the flash memory device.

The flash memory device may use a low-density parity-check (LDPC) decoding technique to decode the data, such as a binary LDPC decoding technique or a non-binary LDPC (NB-LDPC) decoding technique. NB-LDPC decoding techniques typically have better performance than binary LDPC decoding techniques. Although many techniques have been developed for NB-LDPC decoding, these techniques are typically complex and consume power at a device. Various methodologies are needed to reduce power consumption and to improve utilization of processing resources in connection with NB-LDPC decoding techniques.

SUMMARY

A data storage device may include a memory and a controller that is operationally coupled to the memory. The controller may read and write information at the memory. For example, the controller may read and write error correcting code (ECC) codewords at the memory. An ECC codeword may be encoded using a low-density parity-check (LDPC) encoding technique prior to storage at the memory. The memory location storing the ECC codeword may be accessed to generate information (such as a "received word") that corresponds to the ECC codeword but that may include one or more errors.

The controller may include a decoder configured to decode the information using a non-binary LDPC (NB-LDPC) decoding technique. In an illustrative, non-limiting example, the decoder may first determine syndrome values using simple comparisons from the minimum variable-to-check log-likelihood ratios (LLRs) associated with each non-zero element of a finite field. In this example, check-to-variable messages for each connected variable node may then be generated from the syndromes directly using a one-step selection process based on the index of the variable node and the number of deviation nodes corresponding to the syndrome. By using the one-step selection process to generate the check node to variable node messages, the decoder may avoid performing certain iterative calculations, thereby reducing gate count and lowering power consumption at the data storage device. For example, by using the one-step selection process, the decoder may generate the check-to-variable messages in a single clock cycle instead of after multiple clock cycles.

BRIEF DESCRIPTION OF THE DRAWINGS

FIG. 2 illustrates an example of a transformed trellis representing transformed variable node to check node (v2c) log-likelihood ratios (LLRs), where a path of the transformed trellis can be used for syndrome computations;

FIG. 3 illustrates pseudo-code corresponding to an example process that can be performed at the decoder of the data storage device of FIG. 1 to generate check node to variable node (c2v) messages based on syndrome values;

DETAILED DESCRIPTION

Although certain examples are described herein with reference to a data storage device, it should be appreciated that techniques described herein are applicable to other implementations. For example, information can be received by a communication device (e.g., wirelessly or from a wired network) alternatively or in addition to accessing information from a memory. As an illustrative example, LDPC techniques may be utilized to improve reliability of communications (wired or wireless). Those of skill in the art will recognize that techniques described herein are applicable to other implementations. Further, certain examples herein are described in terms of a representative value (e.g., generating a single value) for convenience of description. A single value may be included in a vector that includes multiple values. Therefore, although examples are provided using a single value for clarity of illustration, it should be appreciated that a value may be included in a vector.

Figure 1:
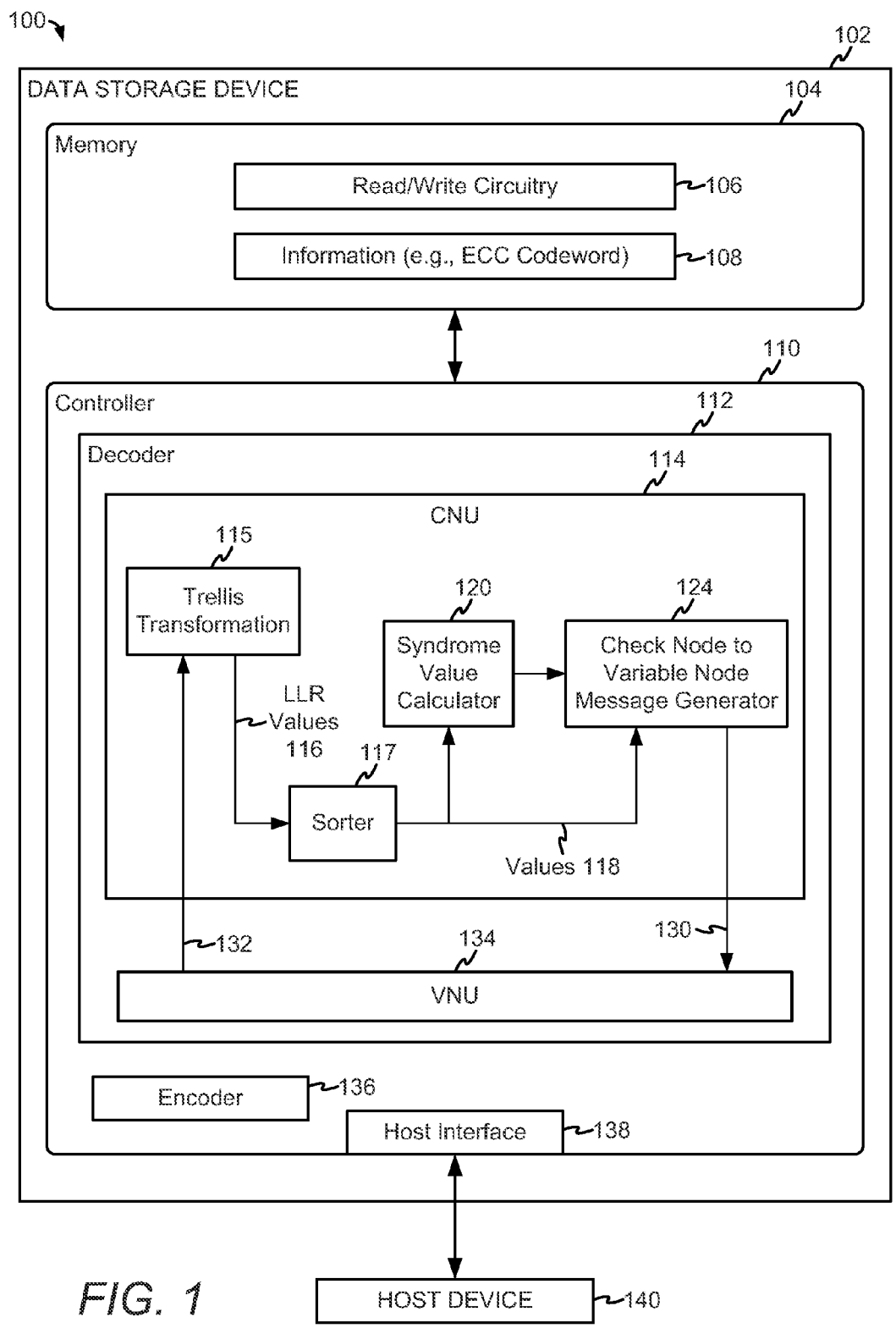
FIG. 1 is a block diagram of a particular illustrative embodiment of a system including a data storage device that includes a decoder.

Referring to FIG. 1, a particular illustrative embodiment of a system is depicted and generally designated 100. The system 100 includes a data storage device 102 and a host device 140. The data storage device 102 and the host device 140 may be coupled via a connection, such as a wireless connection or a bus. The data storage device 102 may be embedded within the host device 140, such as in accordance with a Joint Electron Devices Engineering Council (JEDEC) Solid State Technology Association Universal Flash Storage (UFS) configuration. Alternatively, the data storage device 102 may be removable from the host device 140 (i.e., "removably" coupled to the host device 140). As an example, the data storage device 102 may be removably coupled to the host device 140 in accordance with a removable universal serial bus (USB) configuration.

The data storage device 102 may include a memory 104. The memory 104 may include a non-volatile memory, such as a non-volatile NAND flash memory or a non-volatile resistive random access memory (ReRAM). The memory 104 may have a three-dimensional (3D) memory configuration. As an illustrative example, the memory 104 may include one or more layers having a first orientation and may further include one or more elements, such as vertical columns, having a second orientation perpendicular to (or approximately perpendicular to) the first orientation to enable cross-layer coupling of storage elements of the one or more layers. Alternatively, the memory 104 may have another configuration, such as a two-dimensional (2D) memory configuration.

The memory 104 may include read/write circuitry 106. In a particular implementation, the memory 104 is a non-volatile memory having a three-dimensional (3D) memory configuration that is monolithically formed in one or more physical levels of arrays of memory cells having an active area disposed above a silicon substrate. The data storage device 102 may include circuitry, such as the read/write circuitry 106, that is associated with operation of the memory cells.

The memory 104 may include one or more physical pages of storage elements (e.g., word lines of storage elements). The physical pages may be included in one or more blocks (e.g., an erase group of word lines) of the memory 104. The memory 104 may include multiple blocks of physical pages. The physical pages may each store data, such as information 108. To illustrate, one or more of the physical pages may correspond to a physical page of single-level cell (SLC) storage elements that can be programmed using the read/write circuitry 106 to store threshold voltages indicating bit values of a logical page, such as in connection with a one-bit-per-cell ("X1") configuration. Alternatively, one or more of the physical pages may correspond to a physical page of multi-level cell (MLC) storage elements that can be programmed using the read/write circuitry 106 to store threshold voltages indicating bit values of multiple logical pages, such as in connection with a two-bit-per-cell ("X2") configuration or a three-bit-per-cell ("X3") configuration, as illustrative examples.

The data storage device 102 may further include a controller 110. The memory 104 and the controller 110 may be operationally coupled via a connection, such as a bus. The controller 110 may include a decoder 112, an encoder 136, and a host interface 138. The encoder 136 and the decoder 112 are configured to operate according to one or more low-density parity-check (LDPC) techniques. The decoder 112 is configured to decode non-binary LDPC (NB-LDPC) information, such as using an "extended min-sum" (EMS) LDPC decoding technique and/or a "minimum-maximum" (min-max) LDPC decoding technique.

The decoder 112 includes a check node unit (CNU) 114 and a variable node unit (VNU) 134. The CNU 114 may include a trellis transformation stage 115, a sorter 117, a syndrome value calculator 120, and a check node to variable node message generator 124.

The controller 110 is configured to receive data and instructions from the host device 140 via the host interface 138 and to send data to the host device 140 via the host interface 138. For example, the controller 110 may send data to the host device 140 via the host interface 138 and may receive data from the host device 140 via the host interface 138.

The controller 110 is configured to send data and commands to the memory 104 and to receive data from the memory 104. For example, the controller 110 is configured to send data and a write command to cause the memory 104 to store the data to a specified address of the memory 104. The controller 110 is configured to send a read command to read data from a specified address of the memory 104.

The host device 140 may correspond to a mobile telephone, a computer, (e.g., a laptop, a tablet, or a notebook computer), a music player, a video player, a gaming device or console, an electronic book reader, a personal digital assistant (PDA), a portable navigation device, another electronic device, or a combination thereof. The host device 140 may communicate via a host controller, which may enable the host device 140 to communicate with the data storage device 102. The host device 140 may operate in compliance with a JEDEC Solid State Technology Association industry specification, such as an embedded MultiMedia Card (eMMC) specification or a Universal Flash Storage (UFS) Host Controller Interface specification. The host device 140 may operate in compliance with one or more other specifications, such as a Secure Digital (SD) Host Controller specification as an illustrative example. Alternatively, the host device 140 may communicate with the data storage device 102 in accordance with another communication protocol.

In operation, the controller 110 may receive data to be stored at the memory 104. For example, the controller 110 may receive a request for write access from the host device 140 via the host interface 138 to write data at the memory 104. In response to receiving the data, the controller 110 may input the data to the encoder 136 to encode the data. The encoder 136 may encode the data using a low-density parity-check (LDPC) encoding technique. For example, the controller 110 may input the data at the encoder 136, and the encoder 136 may encode the data using an LDPC encoding technique to generate an error correcting code (ECC) codeword. The ECC codeword may correspond to the information 108.

The controller 110 may send the ECC codeword to the memory 104. To illustrate, the controller 110 may cause the read/write circuitry 106 to store the information 108 at the memory 104, such as at a word line of storage elements of the memory 104.

The controller 110 may receive a request for read access to the memory 104 from the host device 140. For example, the controller 110 may receive a request for read access to the information 108 from the host device 140 via the host interface 138. In response to receiving the request for read access, the controller 110 may access the information 108. For example, the controller 110 may cause the read/write circuitry 106 to sense the information 108 from the memory 104. The read/write circuitry 106 may cause the information 108 to be output to the controller 110 (e.g., via a set of data latches of the memory 104).

In response to receiving the information 108, the decoder 112 may perform a decoding operation using a NB-LDPC decoding technique to decode the information 108. The information 108 may correspond to an ECC codeword having one or more errors (or a "received word") that is input to the decoder 112 for correction of the one or more errors using a NB-LDPC decoding technique. The CNU 114 may transform the reliabilities of symbol values of the information 108 and generate the transformed log-likelihood ratio (LLR) values 116. In an illustrative embodiment, the reliabilities may be generated based on "soft" values that are generated by sensing the information 108 using a soft read technique. The LLR values 116 can be graphically represented by a transformed trellis. An illustrative example of a transformed trellis is described further with reference to FIG. 2.

For an NB-LDPC code over a finite field of size q (i.e., GF(q)), each message vector includes q LLRs. The LLRs for a message vector may be denoted by $l(\alpha)=\log(P(\hat{\alpha})/P(\alpha))$, where $\alpha$ equals to each element of GF(q) and $\hat{\alpha}$ is the most likely element. Accordingly, each LLR is non-negative, and the smaller the LLR, the more reliable the corresponding message (with a zero LLR indicating the highest reliability). The LLR vector from check node m to variable node n may be denoted by $V_{m,n}$ and that from variable node n to check node m by $U_{m,n}$. $S_c(n)$ (or $S_v(m)$) is the set of check (variable) nodes connected to variable (check) node n (or m). Let $L(m|a_n=\alpha)$ be the set of sequences of finite field elements $[a_j]$ ($j \in S_v(m) \backslash n$) such that $\Sigma j \in S_v(m) \backslash n h_{m,j} a_j = h_{m,n} \alpha$ (i.e., the set of sequences that satisfy the check equation for the m th row of H, given that the n th symbol is $\alpha$). This set is also referred to as the configuration set, and each sequence in this set is called a configuration.

The decoder 112 may be a trellis-based min-max decoder for NB-LDPC codes and may be configured to utilize a trellis representation of v2c messages. The v2c messages, $U_{m,n}$, may be represented by the nodes in a trellis, and computation of c2v messages, $V_{m,n}$, is mapped to constructing paths on the trellis. The trellis transformation stage 115 may transform a trellis according to $\hat{u}_{m,n}(\alpha)=u_{m,n}(\alpha+\hat{\alpha})$. In the trellis for $\hat{u}_{m,n}$, the LLR corresponding to the zero field element is zero. An example of a transformed trellis for a code over GF(4) is described further with reference to FIG. 2.

The sorter 117 is responsive to the LLR values 116. The sorter 117 may sort the LLR values 116 (e.g., by magnitude) to generate sorted values 118. The sorted values 118 may include a first value, such as a least value of the LLR values 116 ("min1"), and a second value, such as a next-least value of the LLR values 116 ("min2").

The syndrome value calculator 120 may be responsive to a subset of the sorted values 118, such as min1 values of the sorted values 118. The syndrome value calculator 120 may calculate a syndrome value based on the min1 values. The syndrome value may be included in multiple syndrome values. To illustrate, for a finite field having size q=4, the syndrome value calculator may generate a set of 4−1=3 syndrome values, and the syndrome value may be included in the set of 3 syndrome values. The syndrome value calculator 120 may further generate an indication that identifies whether a particular path associated with the syndrome value includes multiple deviation nodes.

The check node to variable node message generator 124 may be responsive to the syndrome value and the indication. It should be appreciated that the check node to variable node message generator 124 may be responsive to other information (e.g., the values 118).

The indication may identify a number of deviation nodes (or non-zero values) corresponding to the syndrome value (or in a particular path of a trellis that can be used to graphically represent computation of the syndrome value). The indication may identify whether the particular path includes multiple deviation nodes. For example, a first value of the indication (e.g., a logical "0" value) may represent that a path corresponding to a syndrome value includes a single deviation node. A second value of the indication (e.g., a logical "1" value) may represent that a path corresponding to a syndrome value includes multiple deviation nodes.

The check node to variable node message generator 124 is configured to generate a check node to variable node message (e.g., a variable node update value, such an updated LLR value) based on the syndrome value and the indication. The CNU 114 may provide the check node to variable node message to the VNU 134, such as by sending a c2v message 130 (e.g., one or more values, such as a value of a c2v vector). The VNU 134 may generate updated LLR values based on the c2v message 130 to generate a v2c message 132. Although certain examples are given describing a single check node to variable node message for clarity of description, it will be appreciated that a message (e.g., a check node to variable node message) may correspond to a vector of multiple values. The decoding operational steps described above continue until either the decoder 112 converges on a particular ECC codeword (e.g., "succeeds" at decoding the information 108) or until the decoder 112 reaches a threshold number of iterations without converging on a valid ECC codeword (or "fails" at decoding the information 108 by "timing out").

The decoding techniques described herein enable simplified LDPC decoding operations. For example, the check node to variable node message generator 124 may generate c2v messages for each connected variable node from syndrome values directly using a one-step selection process based on the index of the variable node and the number of deviation nodes corresponding to the syndrome value. By using the one-step selection process to generate check node to variable node messages, the decoder 112 may avoid performing certain iterative calculations, thereby reducing complexity and lowering power consumption at the data storage device 102.

Referring to FIG. 2, a particular illustrative example of a transformed trellis is depicted and generally designated 200. In the example of FIG. 2, the transformed trellis 200 includes four rows and six columns. Each of the rows corresponds to an element of a finite field (or "Galois field"). In the example of FIG. 2, a size of the finite field is four (i.e., GF(q), where q=4). In this case, the finite field includes four elements ($\alpha=0$, $\alpha=1$, $\alpha=\beta$, and $\alpha=\beta^2$) each corresponding to a particular row of the transformed trellis 200, where $\beta$ is a primitive element of GF(4). It should be appreciated that the example of FIG. 2 is illustrative. For example, a finite field may have a size other than four.

In the example of FIG. 2, each row of the transformed trellis 200 includes five LLR values (or "nodes") and a syndrome value (or node). It should be appreciated that the example of FIG. 2 is illustrative and that a trellis may have a different number of nodes, rows, and columns. An LLR of zero indicates that the corresponding finite field element is the hard decision symbol $\hat{\alpha}$ for the associated variable node. Higher values of LLRs indicate lower probabilities that corresponding symbol values are correct. Each row of the transformed trellis 200 for $\alpha \neq 0$ includes a first value and a second value. The first value corresponds to a "least" value (min1) of the row, and the second value corresponds to a "next-least" value (min2) of the row. To illustrate, the example of FIG. 2 illustrates that the row corresponding to $\alpha=1$ may include a first value of five and a second value of eight. The five columns at the left of the transformed trellis 200 represent the five input variable-to-check message vectors, and the column at the right of the transformed trellis 200 represents syndromes.

The transformed trellis 200 graphically illustrates calculation of syndrome values. To further illustrate, assume that row m of H has $d_c$ non-zero entries. Let $T(m|\alpha)$ be the configuration set of the sequences of $d_c$ symbols $[\alpha_j]$ ($j \in S_v(m)$) such that $\Sigma_{j \in S_v}(m) a_j = \alpha$. The syndromes may be determined according to:

$$w(\alpha) = \min_{(a_j) \in T(m|\alpha)} \left( \max_{j \in S_v(m)} u_{m,j}(a_j) \right).$$

Since the syndromes only need to be computed once for all c2v message vectors from the same check node, redundancy has been reduced. Let $\hat{v}_{m,n}(\alpha) = v_{m,n}(\alpha + \hat{\alpha})$ be the transformed c2v messages that are derived by the trellis transformation stage 115. Accordingly, $\hat{v}_{m,n}(0) = 0$. Since 'min' is the last computation done in the check node processing of the min-max NB-LDPC decoding algorithm, only the most reliable nodes, and hence a small number of the nodes with non-zero LLRs in the trellis contribute to the c2v outputs. These non-zero-LLR nodes are called deviation nodes.

Each path of the transformed trellis 200 corresponding to a syndrome value may include a non-zero value (or a "deviation node"). To illustrate, the first path may include a single deviation node (i.e., the node having the value of 5). Other paths may include multiple deviation nodes. For example, a path corresponding to 12-5-0-0-0 includes two deviation nodes. As another example, a path corresponding to 10-5-0-0-0 includes two deviation nodes.

By making use of the properties of GF(4), efficient very large scale integration (VLSI) architectures may be developed to implement the modified trellis-based min-max technique of FIG. 2 with $n_r = 2$ for codes over GF(4), where $n_r$ may indicate the "maximum" number of deviation nodes that can be included in a particular path. The elements of GF(4) are $0, 1, \beta, \beta^2$ and $1 = \beta + \beta^2$. In addition, the techniques described herein allow multiple nodes in the same stage of a trellis to be included in a configuration. Two configurations may be considered for computing $w(\alpha)$ (where $\alpha \neq 0$): one with deviation node $\min1(\alpha)$ and one with the other two $\min1$ nodes as deviation nodes. Syndromes for the min-max technique can be computed according to Table 1:

TABLE 1

| |
|---|
| $w(1) = \min(\min1(1), \max(\min1(\beta), \min1(\beta^2)))$ |
| $w(\beta) = \min(\min1(\beta), \max(\min1(1), \min1(\beta^2)))$ |
| $w(\beta^2) = \min(\min1(\beta^2), \max(\min1(1), \min1(\beta)))$ |

Table 1 illustrates that a syndrome may be equal to one of the three min1 values depending on their relative magnitudes. Hence, instead of computing each equation in Table 1 separately, comparisons may be performed among the three min1 values, and the results may determine which min1 values become the syndromes.

Certain conventional LDPC decoding techniques constrain a path through a trellis (or a configuration) to include a single value in each column (or stage) of the trellis. An example decoding technique in accordance with the present disclosure enables a path (or a configuration) to include multiple values from a particular column (or stage) of the transformed trellis 200. The syndrome value for $\alpha = \beta^2$ may be generated using multiple values of a particular column (or stage) of the transformed trellis 200 (e.g., by selecting multiple LLR values from a particular column of the transformed trellis 200). By removing the constraint that nodes for a configuration come from different stages of a trellis, certain cross-over computations are eliminated, and syndromes may be derived solely from min1 values (i.e., without using min2 values). Through analyzing possible updates that can be made when syndromes are computed solely from min1 values, a simplified process to derive c2v messages may be used without iterative computations. For example, the process may include selecting a particular value for a c2v message based on a selection process (or an "index test") instead of iteratively computing the value. The selection process may be dependent on whether each path corresponding to a syndrome includes a single deviation node or multiple deviation nodes.

FIG. 3 illustrates an example of pseudo-code 300, which may be implemented at the check node to variable node message generator 124 of FIG. 1 to generate a check node to variable node message. The c2v message computations illustrated by the pseudo-code 300 may correspond to a modified trellis-based min-max technique for NB-LDPC decoding, as described further below.

In the pseudo-code 300, w(a) indicates a syndrome value for a particular path corresponding to a particular finite field element (or row) a for a trellis, $\hat{\eta}(\alpha)$ indicates a particular node value of the particular path, $\min1(\alpha)$ corresponds a first value (or "least" value) for the particular path, $idx(\alpha)$ corresponds to a stage index (or column index) of the node corresponding to $\min1(\alpha)$, $\min2(\alpha)$ corresponds to a second value (or "second-least" value) for the particular path, n corresponds to a variable node index value, i corresponds to a first column index value, j corresponds to a second column index value, and $\hat{v}_{m,n}(\alpha)$ indicates a check node to variable node message (e.g., an updated LLR value to be sent to a check node).

The pseudo-code 300 illustrates that a selection process may be performed to generate a check node to variable node message. For example, in the pseudo-code 300, one of three values (w($\alpha$), $\min1(\alpha)$, or $\min2(\alpha)$) may be selected as the check node to variable node message based on a determination whether multiple deviation nodes are included in a particular path of a trellis. Such a selection process may reduce the complexity of LDPC decoding operations by avoiding iterative computations to generate a check node to variable node message. For example, a check node to variable node message may be generated in a single clock cycle by selecting one of the three values instead of using multiple clock cycles to iteratively generate the check node to variable node message, thereby improving throughput of a decoder (e.g., the decoder 112 of FIG. 1).

Figure 4:
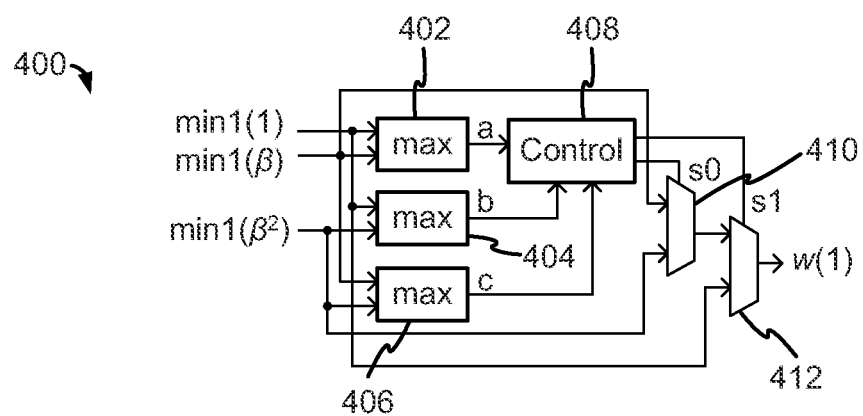
FIG. 4 is a diagram of a particular illustrative embodiment of a syndrome value calculator that may be included in the decoder of the data storage device of FIG. 1.

Certain example implementations are described with reference to FIGS. 3 and 4. FIG. 4 depicts an example of a syndrome value calculator 400, which may correspond to an illustrative implementation of the syndrome value calculator 120 of FIG. 1. The syndrome value calculator includes a "max" unit 402, a "max" unit 404, a "max" unit 406, control logic 408, a multiplexor (MUX) 410, and a MUX 412. The max units 402, 404, and 406 may be configured to generate outputs "a", "b," and "c," respectively.

FIG. 4 shows an example architecture for computing w(1). Each pair of the min1 values are compared first. By analyzing which min1 value w(1) takes, select signals of the multiplexors can be reduced if the min1 values are input to the multiplexors as shown in FIG. 4. If the "max" unit outputs '0' if its upper input is larger than its lower input, then s0=c, and s1=a+b, where '+' denotes a logical OR operation. The configuration leading to the syndrome may be recorded. In this example, since there are two possible configurations for each syndrome, a single flag (or indication) may be used. The single flag may be generated by the syndrome value calculator 120 of FIG. 1. The flag may be set to '1' if the configuration with two deviation nodes leads to the syndrome, and may be set to '0' otherwise. It can be derived that f(1)=(a+b)'. By sharing the results of the "max" units in FIG. 4, another two sets of multiplexors and logic may be used to derive w($\beta$) and w($\beta^2$), as well as their configuration flags.

Figure 5:
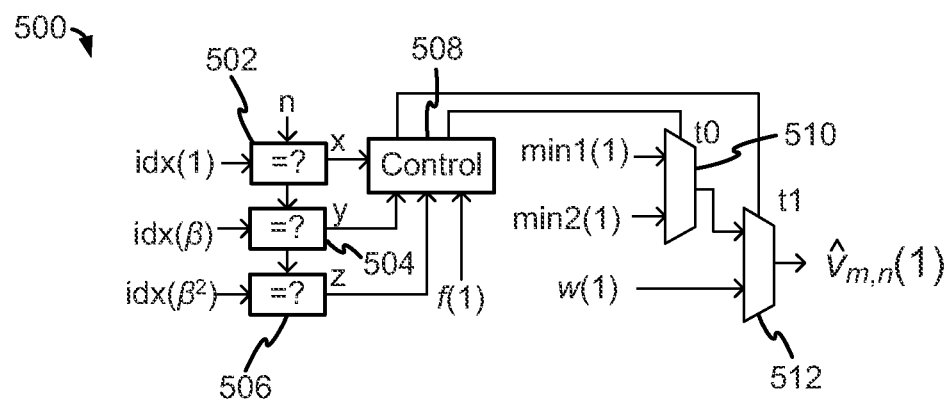
FIG. 5 is a diagram of a particular illustrative embodiment of a check node to variable node message generator that may be included in the decoder of the data storage device of FIG. 1.

FIG. 5 depicts an example of a check node to variable node message generator 500, which may correspond to an illustrative implementation of the check node to variable node message generator 124 of FIG. 1. The check node to variable node message generator 500 includes a comparator 502, a comparator 504, a comparator 506, control logic 508, a MUX 510, and a MUX 512. The control logic 508 is responsive to a configuration flag ("f(1)"). The configuration flag may correspond to the indication described with reference to FIG. 1. The MUX 510 is responsive to t0, min1(1), and min2(1) to generate an output, and the MUX 512 is responsive to t1, w(1), and the output of the MUX 510 to generate $\hat{v}_{m,n}$ (1).

FIG. 5 shows an example architecture for computing $\hat{v}_{m,n}$ (1) based on a syndrome value, such as the syndrome value described with reference to FIG. 1 and/or the syndrome generated in FIG. 4. During operation, n, the index of the variable node for which the c2v message is computed, may be compared to the index of each min1 node. The output of each comparator ("=?") may be asserted if n equals the index. Depending on the configuration corresponding to w(1) and whether the min1 nodes are in stage n, one of the three values, min1(1), min2(1), and w(1) is selected as $\hat{v}_{m,n}$(1). Using logic reduction, the control signals for the multiplexors may be generated according to t0=x and t1=f(1)(y+x)'. To compute $\hat{v}_{m,n}$ ($\beta$) and $\hat{v}_{m,n}$($\beta^2$), another two sets of the multiplexors may be utilized. Control signals for the additional two sets of multiplexors may be generated by reusing the index comparison results.

The a posteriori information for a variable node may be determined by summing channel information (e.g., the information 108) and c2v vectors from all connected check nodes. Subtracting the sum by the c2v vector from check node m may generate the v2c vector to check node m. Normalization for v2c messages may be performed using a tree that includes 2-input "min" operators to find a smallest LLR of a vector. The smallest LLR may be subtracted from each v2c message. When all the q messages (for GF(q), such as GF(4)) in a vector are kept, trellis transformation and multiplication with $h_{i,j}$ may be implemented by barrel shifters.

Quasi-cyclic (QC) LDPC codes may be utilized in connection with the present disclosure. Although QC LDPC codes are described for illustration, it should be appreciated that the techniques described herein are applicable to non-QC LDPC codes. QC LDPC codes may be efficiently implemented in hardware. The parity-check matrix (or H matrix) of these codes includes sub-matrixes of the same dimension. Each sub-matrix is either a zero or a $\alpha$-multiplied cyclic permutation matrix (CPM), which is a permutation matrix with the non-zero entry in a row equaling that in the previous row multiplied by $\alpha$. A decoder, such as the decoder 112, may be designed to implement such codes. A sliced message passing scheme may be implemented in a decoding process. If a size of the sub-matrixes is e×e, e variable node units (VNUs) may process one block column of sub-matrixes in H simultaneously. A number of check node units (CNUs) of the decoder 112 may correspond to the number of rows in H, and all rows may be processed in parallel. For a row of H, there may be only one non-zero entry in each block of e columns. Each CNU may compare one v2c message vector with intermediate min1 and min2 vectors stored in registers and may update those values in one clock cycle. If H is regular, and the row weight is $d_c$, it may take $d_c$ clock cycles to find the min1 and min2 nodes for each finite field element and each row of H. The syndrome computation architecture in FIG. 4 and the c2v message computation architecture in FIG. 5 may be incorporated in the CNUs. From the min1 nodes, the syndromes may be computed in one clock cycle and one c2v message vector may be computed by each CNU at a time. Although the c2v message computation architecture in FIG. 5 may be busy in each clock cycle, the syndrome computation architecture in FIG. 4 may be activated for one clock cycle in each decoding iteration, reducing power consumption of the decoder. If there is one CNU for each row of H, c2v message vectors for the variable nodes in one clock column of H may be generated during a clock cycle. The c2v message vectors may be used to carry out the corresponding variable node processing, and the updated v2c message vectors may be sent to comparators of the CNUs to compute the min1 and min2 values to be used in the next decoding iteration. In this example, the v2c messages need not be stored (e.g., may be discarded), and the c2v messages may be generated from the min1, min2 and syndrome values when needed.

To further illustrate, in an illustrative example, a decoder first determines syndrome values using simple comparisons from the minimum variable-to-check LLRs associated with each non-zero finite field element. Then the check-to-variable messages for each connected variable node are generated from the syndromes directly using a one-step selection process based on the index of the variable node and the number of deviation nodes corresponding to the syndrome. An example decoding technique is described further with reference to FIG. 6.

Figure 6:
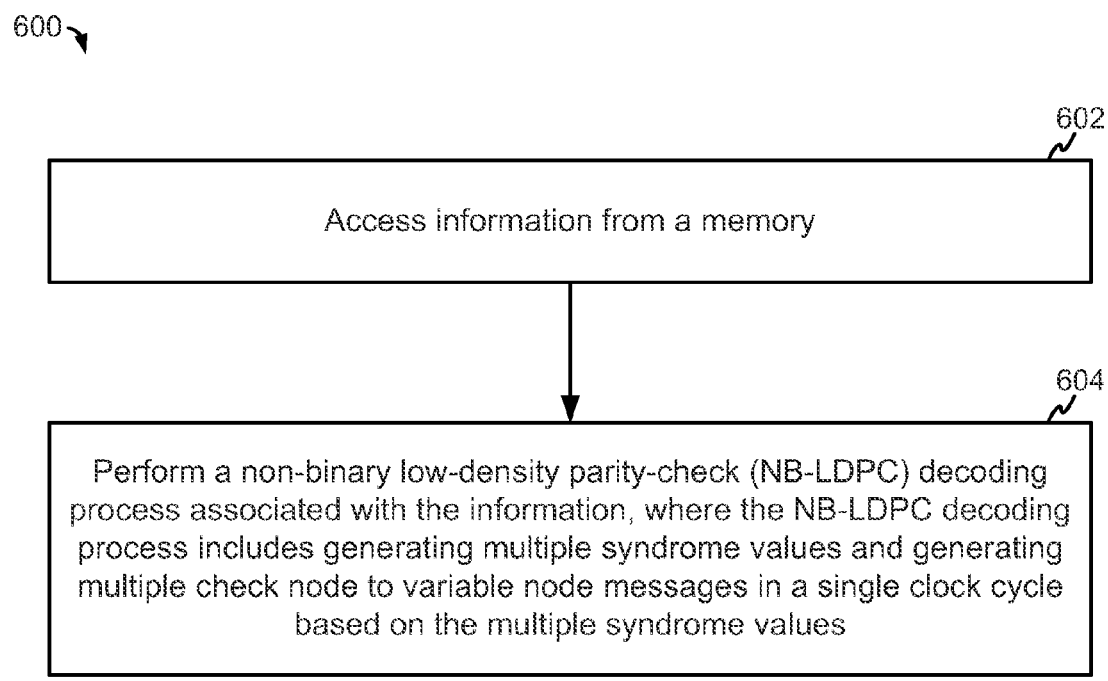
FIG. 6 illustrates a particular illustrative embodiment of a method of operation of the data storage device of FIG. 1.

Referring to FIG. 6, a particular illustrative of a method is depicted and generally designated 600. The method 600 may be performed by the data storage device 102. The method 600 includes accessing information from a memory, at 602. The information may correspond to the information 108, and the memory may correspond to the memory 104. The information may be accessed by the controller 110. The method 600 further includes performing a non-binary low-density parity-check (NB-LDPC) decoding process associated with the information, at 604. The NB-LDPC decoding process may be performed by the decoder 112, as an illustrative example. The decoder may correspond to a modified trellis-based minimum-maximum (min-max) NB-LDPC decoder.

The NB-LDPC decoding process includes generating multiple syndrome values (e.g., w(1), w($\beta$), and w($\beta$^2), as a non-limiting illustrative example). The multiple syndrome values may be generated by the syndrome value calculator 120 and/or by the syndrome value calculator 400. The NB-LDPC decoding process further includes generating multiple check node to variable node messages in a single clock cycle based on the multiple syndrome values. The multiple check node to variable node messages may include elements of multiple c2v vectors, where the elements correspond to a common syndrome value. For example, the multiple check node to variable node messages may include a message $v_{m,n}(\alpha)$ for a particular value of n and may further include another message $v_{m,n}(\alpha)$ for another value of n. Alternatively or in addition, the multiple check node to variable node messages may include multiple elements of a single c2v vector having entries corresponding to multiple values of $\alpha$, where each value of $\alpha$ corresponds to a respective syndrome value. In this case, the multiple check node to variable node messages may include $v_{m,n}(1)$, $v_{m,n}(\beta)$, and $v_{m,n}(\beta^2)$ for a common value of n, as illustrative examples. The multiple check node to variable node messages may be generated by the check node to variable node message generator 124 and/or by the check node to variable node message generator 500. The multiple check node to variable node messages may be generated in accordance with the c2v message computations illustrated by the pseudo-code 300 of FIG. 3.

The syndrome values may be generated based on first minimum (min1) variable node to check node log-likelihood ratio (LLR) values associated with each non-zero element of a finite field (e.g., GF(q)). For example, the particular size (q) may be equal to four. Alternatively, the particular size may be a different size. The min1 variable node to check node LLR values may be indicated by the values 118 (e.g., may be a subset of the values 118).

The method 600 may further include determining (e.g., by the syndrome value calculator 120 and/or by the syndrome value calculator 400) whether multiple deviation nodes correspond to the syndrome values. The method 600 may further include generating (e.g., by the syndrome value calculator 120 and/or by the syndrome value calculator 400) multiple indications for the syndrome values based on the determinations. To illustrate, the indications may include a particular indication of whether multiple deviation nodes correspond to a particular syndrome value of the multiple syndrome values (e.g., w(1), as a non-limiting and illustrative example). The particular indication may be generated by the syndrome value calculator 120 and/or by the syndrome value calculator 400. The particular indication may correspond to f(1) of FIG. 5, as a non-limiting illustrative example. It is noted that operations described herein may be performed for each of the multiple syndrome values.

A particular check node to variable node message of the multiple check node to variable node messages may be generated based on the particular indication. As a particular illustrative example, the c2v message 130 may include multiple c2v messages, and the particular check node to variable node message may be included in the c2v message 130. It should be appreciated that multiple check node to variable node messages may be generated based on the multiple syndrome values (e.g., based on the multiple indications).

A one-step selection process may be performed during the single clock cycle (e.g., by the check node to variable node message generator 124 and/or by the check node to variable node message generator 500). The one-step selection process may generate the particular check node to variable node message based on the particular indication and an index of a variable node (e.g., n, the index of the variable node for which the check node to variable node message is computed). As a non-limiting illustrative example, the one-step selection process may be performed during the single clock cycle by selecting one of three values (e.g., min1(1), min2(1), and w(1) as $\hat{v}_{m,n}(1)$) as the check node to variable node message. The one-step selection process may be performed by the check node to variable node message generator 124 and/or by the check node to variable node message generator 500.

Generation of each of the syndrome values (e.g., the particular syndrome value) may be realized using multiple nodes in a single column of a transformed trellis (e.g., the transformed trellis 200). The decoder may correspond to a modified trellis-based minimum-maximum (min-max) NB-LDPC decoder.

Accessing the information stored at the memory may generate a received word. The decoding process may decode the received word (e.g., by correcting one or more errors associated with the received word to generate user data). The information may represent a corrupted or uncorrupted NB-LDPC codeword, and the multiple check node to variable node messages may include LLR values.

Generating the syndrome values can be realized using multiple nodes in a single column of a transformed trellis. To illustrate, referring again to FIG. 2, when multiple deviation nodes in a single column of the transformed trellis 200 are allowed to be in a path, then a particular path may include the "10" and "5" nodes of the second left-most column of the transformed trellis 200 (e.g., instead of the "12" and "5" nodes). In this example, the syndrome values may be computed using min1 values and without using min2 values.

A modified trellis-based min-max decoder for NB-LDPC codes is described herein. By relaxing certain constraints on which nodes can be included in a configuration, a number of hardware units used for computing trellis syndromes may be reduced. A simplified c2v message computation method is also disclosed. The method does not require iterative updates as in other trellis-based decoders, and hence enables messages in a vector to be computed in one clock cycle with simple hardware. In addition, by making use of the properties of GF(4), the hardware implementation architectures may reduce redundancy. As a result, a decoder as described herein requires less area as compared to a conventional decoder. In addition, hardware for trellis syndrome computation may be activated for a single clock cycle in each decoding iteration, and hence power consumption may be reduced. Moreover, higher clock frequency and improved error-correcting performance may be facilitated using techniques described herein.

Although one or more components described herein are illustrated as block components and described in general terms, such components may include one or more microprocessors, state machines, and/or other circuits configured to enable the data storage device 102 (or one or more components thereof) to perform operations described herein. One or more components illustrated herein may be coupled using one or more nodes, one or more buses (e.g., data buses and/or control buses), one or more other structures, or a combination thereof. The data storage device 102 may include one or more physical components, such as hardware controllers, state machines, logic circuits, one or more other structures, or a combination thereof, to enable the data storage device 102 to perform one or more operations described herein. One or more aspects of the data storage device 102 may be implemented using a microprocessor or microcontroller programmed (e.g., by executing instructions) to perform operations described herein. In a particular embodiment, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM). One or more operations described herein as being performed by the decoder 112 may be performed at the memory 104 (e.g., "in-memory" ECC decoding, as an illustrative example) alternatively or in addition to performing such operations at the decoder 112.

The data storage device 102 may be attached to or embedded within one or more host devices, such as within a housing of a host communication device (e.g., the host device 140). For example, the data storage device 102 may be integrated within a packaged apparatus such as a mobile telephone, a music player, a video player, a gaming device or console, an electronic book reader, a personal digital assistant (PDA), a computer, such as a laptop, a tablet, or a notebook computer, a portable navigation device, or other device that uses internal non-volatile memory. However, in other embodiments, the data storage device 102 may be implemented in a portable device configured to be selectively coupled to one or more external devices, such as the host device 140.

To further illustrate, the data storage device 102 may be configured to be coupled to the host device 140 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or a combination thereof. Alternatively or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon. The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
a memory; and
a controller operationally coupled to the memory, the controller including a decoder that is configured to decode non-binary low-density parity-check (NB-LDPC) codes and that includes:
a syndrome value calculator configured to, for each syndrome value of multiple syndrome values:
determine whether a single deviation node or a plurality of deviation nodes correspond to the syndrome value; and
generate an indication of whether multiple deviation nodes correspond to the syndrome value; and
a check node to variable node message generator coupled to the syndrome value calculator and configured to generate multiple check node to variable node messages based on the multiple syndrome values.

2. The data storage device of claim 1, wherein the syndrome value calculator is configured to generate the multiple syndrome values based on first minimum (min1) variable node to check node log-likelihood ratio (LLR) values associated with each non-zero element of a finite field.

3. The data storage device of claim 1, wherein the check node to variable node message generator is further configured to generate the multiple check node to variable node messages in a single clock cycle.

4. The data storage device of claim 1, wherein the check node to variable node message generator is further configured to generate a particular check node to variable node message of the multiple check node to variable node messages based on the indication.

5. The data storage device of claim 4, wherein the check node to variable node message generator is further configured to perform a one-step selection process during a single clock cycle, and wherein the one-step selection process generates the particular check node to variable node message based on the indication and an index of a variable node.

6. The data storage device of claim 1, wherein the controller is configured to access information stored at the memory to generate a received word, and wherein the decoder is further configured to initiate a decoding process to decode the received word, the decoding process including generating the multiple check node to variable node messages.

7. The data storage device of claim 6, wherein the information represents a corrupted or uncorrupted NB-LDPC codeword, and wherein the multiple check node to variable node messages include log-likelihood ratio (LLR) values.

8. The data storage device of claim 1, wherein the syndrome value calculator is configured to generate a particular syndrome value of the multiple syndrome values using multiple nodes in a single column of a transformed trellis, and wherein the decoder includes a modified trellis-based minimum-maximum (min-max) NB-LDPC decoder.

9. The data storage device of claim 1, wherein the memory is a non-volatile memory that is monolithically formed in one or more physical levels of arrays of memory cells having an active area disposed above a silicon substrate, and further comprising circuitry associated with operation of the memory cells.

10. A method comprising:
in a data storage device that includes a memory and a controller, performing by the controller:

accessing information from the memory; and performing a non-binary low-density parity-check (NB-LDPC) decoding process associated with the information, wherein the NB-LDPC decoding process includes, for each syndrome value of multiple syndrome values:

determining whether a single deviation node or a plurality of deviation nodes correspond to the syndrome value;

generating an indication of whether multiple deviation nodes correspond to the syndrome value; and generating multiple check node to variable node messages based on the multiple syndrome values.

11. The method of claim 10, wherein the multiple syndrome values are generated based on first minimum (min1) variable node to check node log-likelihood ratio (LLR) values associated with each non-zero element of a finite field.

12. The method of claim 10, wherein the multiple check node to variable node messages are generated in a single clock cycle.

13. The method of claim 10, wherein a particular check node to variable node message of the multiple check node to variable node messages is generated based on the indication.

14. The method of claim 13, wherein a one-step selection process is performed during a single clock cycle, and wherein the one-step selection process generates the particular check node to variable node message based on the indication and an index of a variable node.

15. The method of claim 10, wherein accessing the information stored at the memory generates a received word, wherein the NB-LDPC decoding process decodes the received word, and wherein the NB-LDPC decoding process is performed by a decoder of the controller.

16. The method of claim 15, wherein the information represents a corrupted or uncorrupted NB-LDPC codeword, and wherein the multiple check node to variable node messages include log-likelihood ratio (LLR) values.

17. The method of claim 10, wherein the NB-LDPC decoding process includes generating the multiple syndrome values, wherein generating a particular syndrome value of the multiple syndrome values can be realized using multiple nodes in a single column of a transformed trellis, and wherein the decoder includes a modified trellis-based minimum-maximum (min-max) NB-LDPC decoder.

18. The method of claim 10, wherein the memory is a non-volatile memory that is monolithically formed in one or more physical levels of arrays of memory cells having an active area disposed above a silicon substrate, and wherein the data storage device further includes circuitry associated with operation of the memory cells.

\* \* \* \* \*